United States Patent [19]

Bock

[11] 4,318,048

[45] Mar. 2, 1982

[54] PHASE SHIFTER CONTROL CIRCUIT

[75] Inventor: Ditmar H. Bock, Colden, N.Y.

[73] Assignee: Calspan Corporation, Buffalo, N.Y.

[21] Appl. No.: 137,668

[22] Filed: Apr. 4, 1980

[51] Int. Cl.³ .......................... G05F 1/68; H03K 1/12
[52] U.S. Cl. .................................... 328/155; 328/150
[58] Field of Search ...................... 328/155, 150, 127; 324/83 FE; 364/607; 323/212

[56] References Cited

U.S. PATENT DOCUMENTS

| | | | |
|---|---|---|---|
| 3,932,818 | 1/1976 | Masak | 328/167 |
| 4,007,331 | 2/1977 | Flanagan | 178/88 |
| 4,039,930 | 8/1977 | Lukas | 328/155 |

Primary Examiner—Alfred E. Smith
Assistant Examiner—T. N. Grigsby
Attorney, Agent, or Firm—Biebel, French & Nauman

[57] ABSTRACT

A phase shifter control circuit having an integrator circuit for developing as a phase control signal the time integral of an input command or error signal, a reset circuit responsive to the phase control signal for generating a correction signal whenever the phase control signal reaches predetermined limits, and summing circuits for combining the correction signal with the input signal and with the phase control signal whereby the phase control signal is substantially instantaneously adjusted to a value between the predetermined limits.

12 Claims, 6 Drawing Figures

PHASE SHIFTER CONTROL CIRCUIT

The U.S. Government has rights in this invention pursuant to contract No. F19628-78-C-0140 awarded by the Department of the Air Force.

BACKGROUND OF THE INVENTION

With presently known electronic phase shifting circuits phase changes of up to one cycle or 360 degrees are accomplished by varying a control voltage between a lower limit and an upper limit. The lower limit may correspond to zero degrees, whereas the upper limit may correspond to an angle slightly in excess of 360 degrees to assure that all angles between zero and 360 degrees are attainable. In as much as phases of more than 360 degrees have corresponding values less than 360 degrees, it is not necessary nor practical to design any circuit wherein the upper voltage limit of which would permit phase changes significantly greater than 360 degrees. Thus if it were desired to shift phase from, say, 360 degrees to 440 degrees, the control voltage would be lowered from near its upper limit at 360 degrees down to a lower value corresponding to 80 degrees (the equivalent of 440 degrees). During this change or "flyback" in voltage, passage occurs through all phase angles between 360 and 80 degrees. In many phase shifter applications the transition time for such "flybacks" is relatively long and undesirable.

For example, if the phase shifter is employed to steer a radar antenna beam to a particular target location, passage of the beam through other angles will reduce the response time of the system in arriving at the target's azimuth. It is therefore desirable to have a phase shift that responds essentially instantaneously to a new command position.

In other applications such as, for example, closed-loop feed-back systems, if the time necessary to detect an error condition is less than the time required for the phase to "flyback" to the corrected value, undesirable or detrimental instabilities or oscillations may occur which further serve to impede the correction process. By way of example, assume an error signal calling for a phase correction from 360 degrees to 440 degrees. Since the control voltage is near its upper limit at 360 degrees and can go no higher toward 440, such voltage must be reduced to a lower value which will correspond to a phase of 80 degrees. If the time for such reduction is longer than the time constant of the phase error detection, then an even greater error will be detected as the phase passes below its initial value of 360 degrees on its way to the corrected value of 80 degrees. At the same time a new correction signal will be generated attempting to increase the control voltage and cause the phase to change direction away from the desired angle, thereby creating unnecessary delay before stabilization at the corrected angle. It is therefore desirable to have the correction in phase take place substantially instantaneously or within the time constant of the error detection function.

SUMMARY OF THE INVENTION

The foregoing difficulties are overcome according to the teachings of the present invention which provides a phase shift circuit controller permitting substantially instantaneous phase shifts in response to either a command signal or an error signal.

Essentially, the present invention provides a novel circuit for generating the applied phase controlling voltage in such a manner that whenever such voltage nears predetermined limits, usually upper or lower limits, signals are developed which, when combined with the normal input to such circuit, deliver a phase controlling voltage that is substantially instantaneously at the desired value; to thereby eliminate transitions through intermediate values.

An integrating circuit is provided to accommodate the normal fluctuations of the phase controlling voltage between the chosen predetermined limits; however, when the voltage reaches such limits a reset circuit is actuated which delivers a correction signal that when combined with the normal input signal to the integrator circuit and the output therefrom results in a phase controlling voltage that is immediately at the desired value.

Basically, then, the present invention provides a phase shifter control circuit, comprising; a first summing circuit for combining a normal input signal with a correction signal to produce an output signal representing the sum thereof, an integrator circuit responsive to such output signal for developing an integrated signal representing the time integral thereof and a second summing circuit for combining the integrated signal with the correction signal.

BRIEF DESCRIPTION OF THE DRAWINGS

For a fuller understanding of the present invention, reference should now be made to the following detailed description thereof taken in conjunction with the accompanying drawings wherein.

DESCRIPTION OF THE PREFERRED EMBODIMENT

By way of illustration and not limitation, the ensuing discussion will assume "flybacks" or jumps of 360 degrees in either an increasing or decreasing phase sense whenever the source of control voltage (to which the phase shifter is responsive) reaches its upper or lower limits. However, it would be well within the knowledge of one skilled in this art to make the necessary circuit parameter modifications to cause one or more instantaneous "flybacks" of 360 degrees or less at predetermined values of phase controlling voltage between the upper or lower limits thereof.

Figure 1:
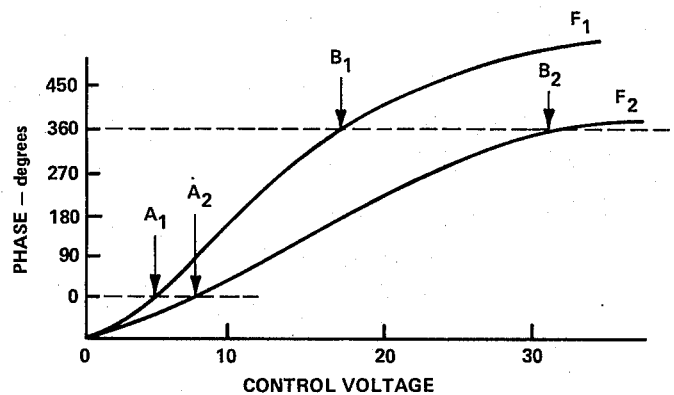
FIG. 1 is a plot of the control characteristics of a typical phase shifter.

FIG. 1 illustratively depicts the relationship between control voltage and phase at two frequencies, $F_1$ and $F_2$. In order to provide for phase shifts at all angles between zero and 360 degrees, the control voltage must be varied from $A_1$ to $B_1$ at frequency $F_1$ and from $A_2$ to $B_2$ at frequency $F_2$, respectively. In theory, voltages below $A_n$ or above $B_n$ at frequency $F_n$ are not required since phase shifts of below zero or above 360 degrees have corresponding values somewhere between, as noted earlier. In practice however, due to the effects of manufacturing variations, temperature changes, humidity changes and the like, it is common to extend the range of control voltages slightly to permit an upper phase limit of, say, 400 degrees to assure that at least all phases between zero and 360 degrees are attainable.

Figure 2:
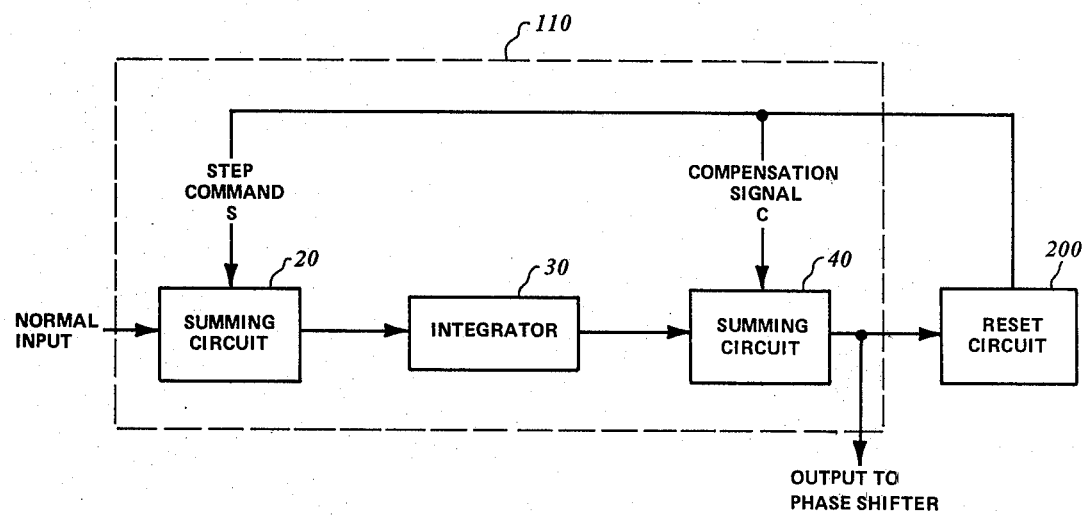
FIG. 2 is a block diagram of the phase shifter circuit according to the present invention.

The flow or block diagram of the phase shifter control circuit according to the present invention is shown in FIG. 2 as comprising two main components, an integrating circuit 110 and a reset circuit 200.

The integrating circuit 110 comprises a first summing circuit 20, an integrator 30 and a second summing circuit 40. The normal input to circuit 20 is a phase rate signal, the integral of which functions to initiate the phase changing process. The output signal from summing circuit 40 is the control voltage (between the limits $A_n$ and $B_n$) to which the phase shifter is responsive. This output also is detected as an input to reset circuit 200, as will become apparent hereinbelow. In normal operation (between the phase control voltage values of $A_n$ and $B_n$), the integrator 30 functions to follow the normal variations in phase control voltage in response to the phase rate applied as an input to first summing circucorrection signal is applied simultaneously to the first and second summing circuits 20 and 40, respectively, to initiate an instantaneous change in the control voltage applied as an output from second summing circuit 40 to the phase shifter to thereby instantaneously return the control voltage within the limits of $A_n$ and $B_n$ at a value which corresponds to a phase rs have limited rate of change in output voltage and therefore cannot respond instantaneously to an injected signal. However, since summing circuits in general and circuits 20 and 40, in particular, respond virtually instantaneously, the appropriate correction signals are applied thereto.

To accomplish a substantially instantaneous change in phase it is essential that the new voltage corresponding to the desired phase shift appear instantaneously at the output of integrating circuit 110 in response to the signal which commands such change. However, since the integrator 30 is inherently not capable of responding instantaneously to a sudden change in voltage, other means are provided to permit the new voltage to appear at the output of the integrating circuit 110 virtually instantaneously.

Figure 3A:
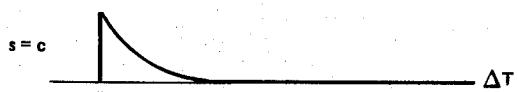
FIGS. 3a-c are plots of voltage wave forms with respect to time.
Figure 3B:
Figure 3C:
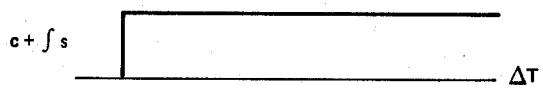

The manner in which the correction signal functions can best be understood in conjunction with the graphs shown in FIGS. 3a-3c. For ease in explanation the correction signal applied to summing circuit 20 will be termed a "step command", s, whereas the same signal applied to summing circuit 40 will be termed a "compensation signal", c.

If it is assumed that the phase rate or normal input signal to circuit 20 is zero (for simplification) then FIG. 3a shows the effect with respect to time of the signal s superposed onto the phase rate signal as an output from circuit 20.

FIG. 3b depicts the output signal from integrator 30 as a function of time, and FIG. 3c represents the sum of FIG. 3a and FIG. 3b and corresponds to the control signal at the output of phase circuit 40.

It can thus be seen that the effect of injecting the correction signal at summing circuit 20 and summing circuit 40 results in an instantaneous change in control voltage applied to the phase shifter.

Figure 4:
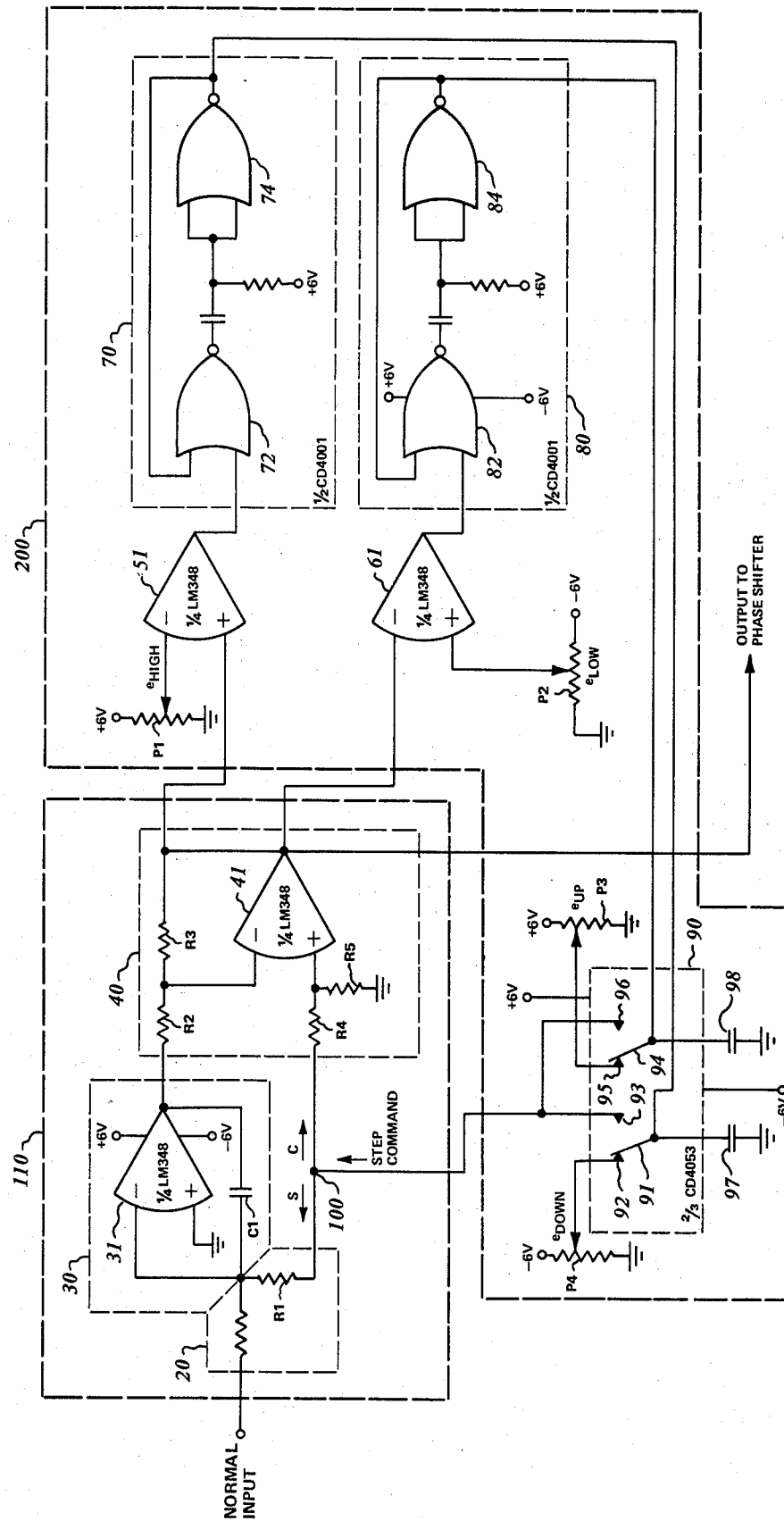
FIG. 4 is a circuit diagram of the phase shifter control circuit.

The values of c and the $\int s$ are chosen to satisfy the requirement that $c + \int s$ equal the desired voltage change to accomplish the instantaneous "flyback" from a voltage at the limits $A_n$ and $B_n$ to a voltage therebetween. Considering the usual inversion in integrating circuits it is found that the function $$s = c = ke^{-t/CR}$$

which is a function of time (t) conveniently generated by discharging a capacitor of capacitance C, charged to k volts, through a resistor (which may be the resistor(s) feeding the integrator 30 and summing circuit 40) with a resistance value of R, satisfies the above requirement. FIG. 4 illustrates a particular implementation of the phase shifter control circuit which can be employed, for example, as a part of a closed loop phase tracking circuit. In which case, the input signal to summing circuit 20 would represent a phase error signal and the output from summing circuit 40 would be the phase control voltage signal employed to correct the phase error. This input to summing circuit 20 is integrated by operational amplifier 31 and the time integral thereof is fed to the inverted input of operational amplifier 41 of summing circuit 40.

The output of summing circuit 40, the phase control voltage signal, is supplied to the phase shifter (not illustrated) and is also supplied as one input to comparators 51 and 61 of reset circuit 200, respectively. Predetermined threshold voltages $e_{HIGH}$ and $e_{LOW}$, that may be functions of frequency etc., are supplied as second inputs to comparators 51 and 61 respectively. When the phase control voltage signal exceeds the threshold ($e_{HIGH}$) at a voltage equivalent to say, 400°, comparator 51 triggers a one-shot circuit 70 including logic-type inverters 72 and 74.

In switch 90, as illustrated in FIG. 4, switch arm 91 normally contacts terminal 92 and switch arm 94 normally contacts terminal 95 and, as a result, capacitors 97 and 98 are normally charged to $e_{DOWN}$ and $e_{UP}$, respectively. In response to one-shot circuit 70 switch 91 is caused to contact terminal 93 which connects capacitor 97 charged to $e_{DOWN}$, representing the correction signal, to the junction 100 of input resistors to the summing circuits 20 and 40 thus effecting a transition from an angle of 400° to an angle of 40° (360 degrees away from 400°). This connection is maintained for a suitable time period to essentially completely discharge the capacitor 97. Five time constants of the resulting RC network when capacitor 97 is discharged is a suitable time period for this purpose. After this time period, switch arm 91 will be caused to contact terminal 92 to thereby permit recharging of capacitor 97 to $e_{DOWN}$.

Similarly, in the opposite sense, when the inverted control voltage falls below the threshold ($e_{LOW}$) at a voltage equivalent to 0°, comparator 61 triggers a one-shot circuit 80 including logic-type inverters 82 and 84. In response to one-shot circuit 80 switch arm 94 is caused to contact terminal 96 which connects capacitor 98 charged to $e_{UP}$, representing the correction signal, to the junction 100 of input resistors to the summing circuits 20 and 40 thus effecting a transition from an angle of 0° to an angle of 360°. This connection is maintained for a suitable time period to essentially completely discharge the capacitor 98. Five time constants of the resulting RC network when capacitor 98 is discharged is a suitable time period for this purpose. After this time period, switch arm 94 will be caused to contact terminal 95 to thereby permit recharging of capacitor 98 to $e_{UP}$.

It should be noted that switch 90 is functionally represented as electro-mechanical device for simplicity but, in actuality, would be electronic switches and would be composed of a number of transistors configured as an analog switch as is well known in the art.

Since no specific values were given for $e_{HIGH}$, $e_{LOW}$, $e_{UP}$, and $e_{DOWN}$, they can be chosen with the following restrictions:

$$e_{LOW} + |e_{UP}| > e_{HIGH} - |e_{DOWN}|$$
$$e_{HIGH} - |e_{DOWN}| > e_{LOW}$$
$$e_{HIGH} > e_{LOW} + |e_{UP}|$$

This will accommodate the vagaries of various phase shifters or of a given phase shifter at various frequencies, temperature, etc. and will also permit the selection of different thresholds and jump sizes (voltages). Although $e_{HIGH}$, $e_{LOW}$, $e_{UP}$ and $e_{DOWN}$ are illustrated as selectively derived from potentiometers P1 to P4, respectively, they could also be obtained by consulting a memory or function generator.

The circuit of FIG. 4 can be constructed using standard integrated circuits. The operational amplifiers 31, 41, 51 and 61 can each of ¼ of a National Semiconductor LM348 quad operational amplifier. The one-shot circuits 70 and 80 can each be ½ of an RCA CD4001 quad NOR gate. The switches 91 and 94 can each of ⅓ of an RCA CD4053 analog switch. Additionally, in order that the step command(s) and compensation signal (c) be equal, as required, resistance R1 of summing circuit 20 must be substantially twice the value of each of the identical resistors R2-R5 of summing circuit 40 and capacitors 97 and 98 of switch 90 must each be substantially twice the value of capacitor C1 of integrator 30.

While the invention has been described and illustrated as an analog or more accurately, hybrid analog/digital circuit, it is obvious that other changes will occur to those skilled in the art. For example, the digital equivalents of the integrator (up-down counter), limit sets (arithmetic logic units and multiplying analog-to-digital converter) and reset circuitry (overflow features) are capable of doing the same tasks, if convenient. It is therefore intended that the scope of the present invention is to be limited only by the scope of the appended claims.

I claim:

1. A control circuit for phase shifters, comprising;
   (a) a first summing circuit for combining an input signal with a correction signal to produce a first output signal representing the sum thereof,
   (b) an integrator circuit responsive to said first output signal for developing an integrated signal representing the time integral thereof, and
   (c) a second summing circuit for combining said integrated signal with said correction signal to produce a second output signal representing the sum thereof.

2. The circuit according to claim 1, further comprising;
   (d) a reset circuit for generating said correction signal whenever the value of said second output signal reaches predetermined limits.

3. The circuit according to claim 2, wherein;
   (e) said predetermined limits comprise upper and lower voltages corresponding to a phase shift of substantially 360 degrees.

4. The circuit according to claim 2, further comprising;
   (e) means for varying said predetermined limits.

5. The circuit according to claim 4, further comprising;
   (f) means for varying the value of said correction signal.

6. The circuit according to claim 2, further comprising;
   (e) means for varying the value of said correction signal.

7. A control circuit for phase shifters, comprising;
   (a) means for integrating a signal to produce a phase controlling voltage signal,
   (b) means for detecting said phase controlling voltage signal and for generating a correction signal whenever said phase controlling voltage signal falls outside the range of predetermined limits, and
   (c) means for adding said correction signal to said first mentioned signal and to said phase controlling voltage signal to thereby substantially instantaneously adjust said phase controlling voltage signal to a value between said predetermined limits.

8. The circuit according to claim 7, wherein;
   (d) said last mentioned means comprises first and second summing circuits and wherein,
   (e) said means for integrating is located between said first and second summing circuits.

9. The circuit according to claim 8, further comprising;
   (f) means for varying said predetermined limits.

10. The circuit according to claim 7, further comprising;
    (d) means for varying said predetermined limits.

11. The circuit according to claim 10, further comprising;
    (e) means for varying the value of said correction signal.

12. The circuit according to claim 7, further comprising;
    (d) means for varying the value of said correction signal.

* * * * *

UNITED STATES PATENT AND TRADEMARK OFFICE
CERTIFICATE OF CORRECTION

PATENT NO. : 4,318,048
DATED : March 6, 1982
INVENTOR(S) : Ditmar H. Bock

It is certified that error appears in the above-identified patent and that said Letters Patent are hereby corrected as shown below:

At Col. 3, replace line 18 with the following:

"summing circuit 20.

The reset circuit 200 senses the phase control voltage from summing circuit 40 to determine whether the same lies within the predetermined range $A_n$ and $B_n$. If this range is exceeded, a correction signal is applied simulta-"

At Col. 3, replace line 25 with the following:

"phase angle 360 degrees away.

If some form of correction signal, such as a large voltage or electric charge, were injected into integrator 30, the desired instantaneous change in control voltage would not occur. This is because integrators have limited rate of change in output voltage"

Col. 4, line 7, should start as a new paragraph.

Signed and Sealed this

Twenty-fifth Day of May 1982

[SEAL]

Attest:

*Attesting Officer*

GERALD J. MOSSINGHOFF
*Commissioner of Patents and Trademarks*